United States Patent
Horng

(10) Patent No.: US 8,525,559 B2
(45) Date of Patent: Sep. 3, 2013

(54) NON-OVERLAP CIRCUIT

(75) Inventor: Jaw-Juinn Horng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 72 days.

(21) Appl. No.: 13/193,660

(22) Filed: Jul. 29, 2011

(65) Prior Publication Data
US 2013/0027105 A1   Jan. 31, 2013

(51) Int. Cl.
*H03B 1/00* (2006.01)
*H03K 3/00* (2006.01)

(52) U.S. Cl.
USPC .............................. 327/108; 327/110; 327/112

(58) Field of Classification Search
USPC .......................................... 327/108, 110, 112
See application file for complete search history.

(56) References Cited

U.S. PATENT DOCUMENTS

| | | | |
|---|---|---|---|
| 6,353,345 B1 | 3/2002 | Yushan et al. | |
| 7,714,518 B2 | 5/2010 | Wong et al. | |
| 2007/0257647 A1* | 11/2007 | Chen et al. | 323/282 |
| 2008/0290911 A1* | 11/2008 | Williams | 327/109 |

* cited by examiner

*Primary Examiner* — John Poos
(74) *Attorney, Agent, or Firm* — Duane Morris LLP

(57) ABSTRACT

A non-overlap circuit includes a first delay circuit configured to receive a first input signal and output a first control signal to a driver circuit, sensing circuitry configured to sense a current generated in response to the first control signal coupled through bulk semiconductor of a semiconductor substrate and produce a feedback signal response, and a second delay circuit. The second delay circuit configured to receive the feedback signal from the sensing circuitry and a second input signal and output a second control signal to the driver circuit based on the sensed feedback signal and the second input signal.

18 Claims, 8 Drawing Sheets

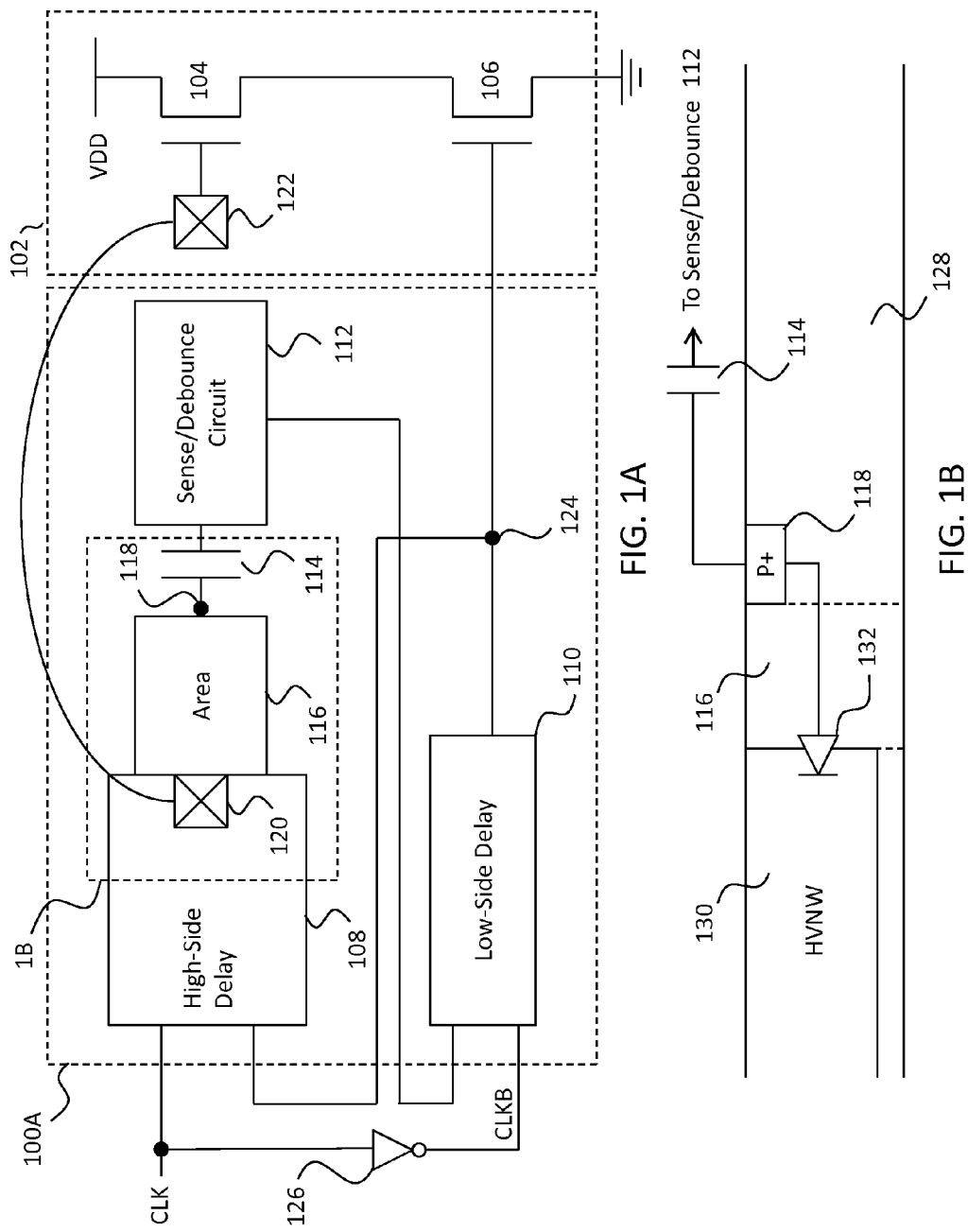

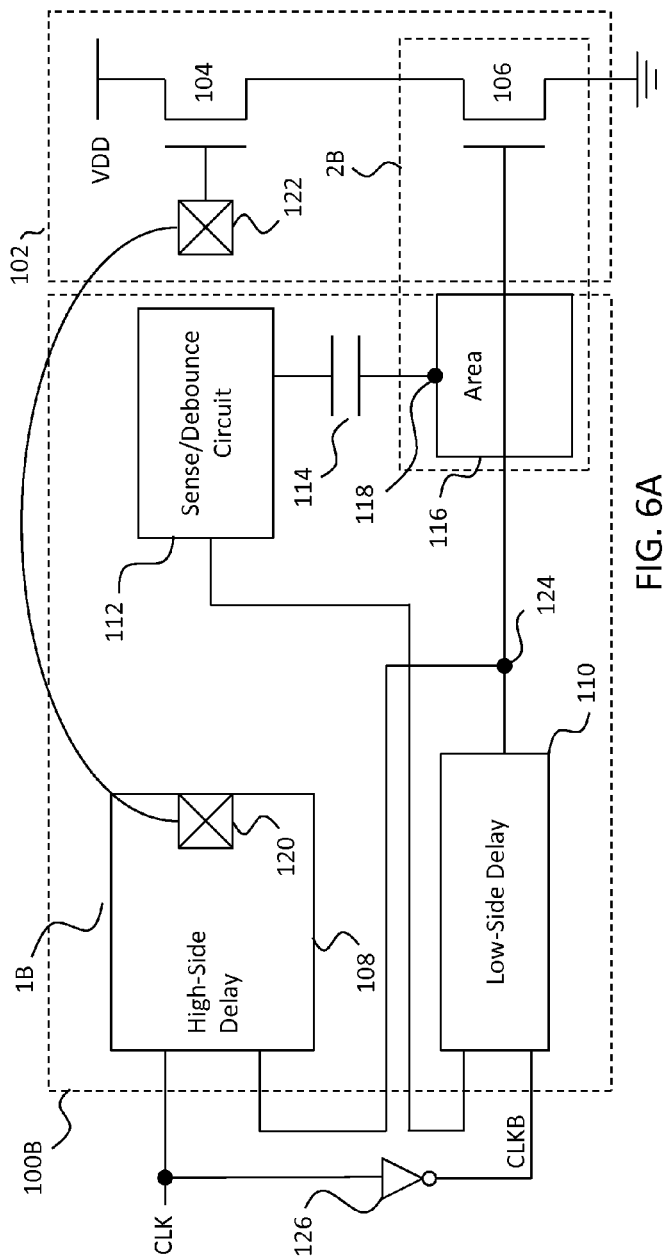
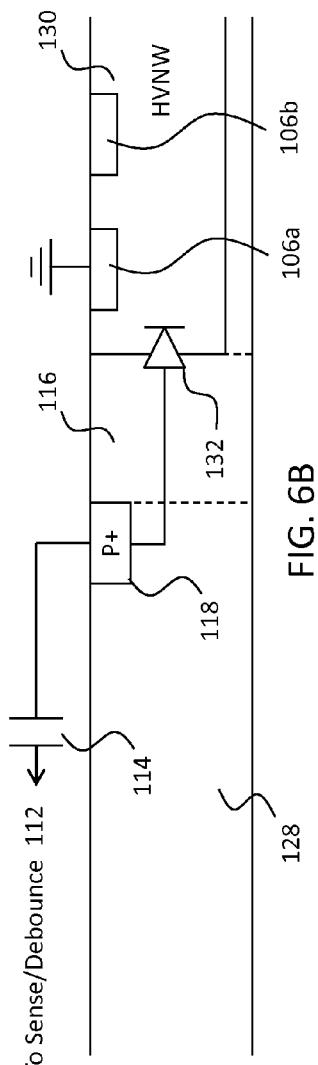
FIG. 6A
FIG. 6B

NON-OVERLAP CIRCUIT

FIELD OF DISCLOSURE

The disclosed circuits and methods relate to integrated circuits ("ICs"). More particularly, the disclosed circuits and methods relate to ICs that include non-overlap circuits.

BACKGROUND

Non-overlap circuits are typically integrated in ICs that frequently switch. For example, non-overlap circuits may be implemented in half-bridge drivers and alternating current ("AC") to direct current ("DC") converters. These non-overlap circuits provide signals to switching transistors, which may be implemented as metal oxide semiconductor field effect transistors ("MOSFETs"), so the transistors do not overlap. Put another way, the signals provided by the non-overlap circuits prevent the low-side and high-side power switches from switching on at the same time.

In high-voltage operations, parasitic capacitance of the switching device is large and varies with process. Timing controls circuits are used to adapt the non-overlap circuits to avoid shoot-through currents that may damage the switching devices.

BRIEF DESCRIPTION OF THE DRAWINGS

FIG. 1A is block diagram of one example of an improved non-overlap circuit.

FIG. 1B is a cross-sectional view of a portion of the non-overlap circuit illustrated in FIG. 1A.

FIG. 6A is a block diagram of another example of an improved non-overlap circuit.

FIG. 6B is a cross-sectional view of a portion of the non-overlap circuit illustrated in FIG. 6A.

DETAILED DESCRIPTION

Figure 2A:
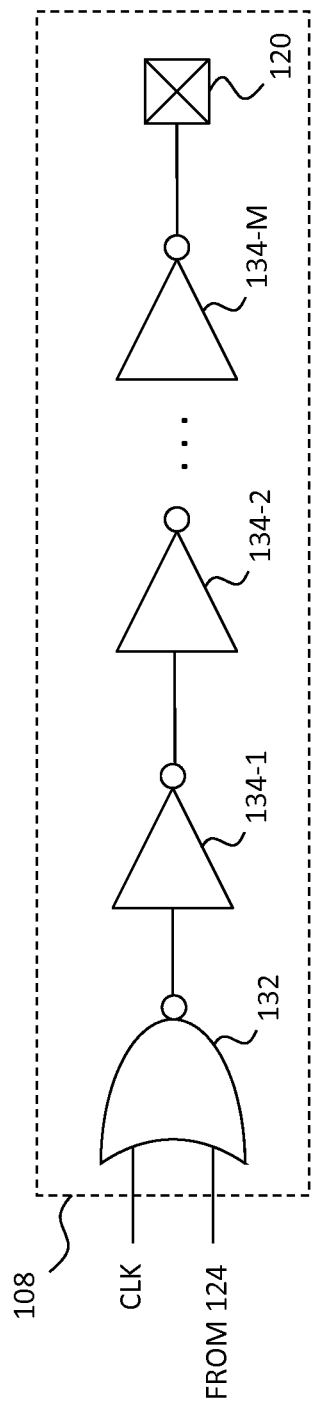
FIGS. 2A and 2B are block diagrams illustrating respective examples of high-side and low-side delay circuits in accordance with FIG. 1A.

An improved non-overlap circuit is disclosed that enables a high voltage output (e.g., up to an greater than 200 volts) while minimizing the chance of a shoot-through current to damage the circuit. FIG. 1A is a block diagram of one example of an improved non-overlap circuit 100A coupled to a driving circuit 102, which includes a first driving transistor 104 and a second driving transistor 106. The respective drains of first and second driving transistors are coupled together, the source of transistor 104 is coupled to supply voltage, $V_{DD}$, and the source of transistor 106 is coupled to ground. Non-overlap circuit 100A includes a high-side delay circuit 108 and a low-side delay circuit 110. A sense and debounce circuit 112 is coupled to a capacitor 114 that is coupled to an area 116 at node 118. Area 116 may be undoped or lightly doped bulk silicon or other semiconductor disposed adjacent to terminal 120, which couples high-side delay circuit 108 to terminal 122 of driving circuit 102. Terminal 122 is coupled to the gate of transistor 104 and may be coupled to terminal 120 via wire bonding as will be understood by one skilled in the art.

Sense and debounce circuit 112 is coupled to an input of low-side-delay circuit 110 for providing feedback timing signals from high-side delay circuit 108 to low-side delay circuit 110. The output of low-side delay circuit 110 is coupled to the gate of transistor 106 and is configured to turn on and off transistor 106. Feedback is provided from the output of low-side delay circuit 110 to an input of high-side delay circuit 108 from node 124, which is disposed between low-side delay circuit 110 and the gate of transistor 106.

High-side delay circuit 108 and low-side delay circuit 110 receive alternating current ("AC") voltage input signals, CLK and CLKB, at respective second inputs. The AC input signal may be received from external circuit (not shown) or from an AC voltage source as will be understood by one skilled in the art. The input signal CLK received at high-side delay circuit 108 may be the inverse of the input signal CLKB received at low-side delay circuit 110. For example, the input signal CLK received at high-side delay circuit 108 may be passed through an inverter 126 to provide input signal CLKB to low-side delay circuit 110.

FIG. 1B is a partial cross-sectional view of a portion of high-side delay circuit 108 and area 116 as identified by square 1B in FIG. 1A. As shown in FIG. 1B, node 118 to which capacitor 114 is coupled is a doped region disposed in a semiconductor substrate 128. In some embodiments, semiconductor substrate is a p-type substrate and doped region 118 is a P+ doped region having a doping concentration that is greater than the doping concentration of bulk semiconductor of area 116. One skilled in the art will understand that substrate 128 and doped region 118 may be n-type substrates and doped regions. High-side delay circuitry 108 is formed in a high-voltage n-well ("HVNW") 130 such that a diode 132 is defined at the interface of substrate 128 and HVNW 130. HVNW has a higher doping concentration than the doping concentration of the bulk semiconductor of area 116. Area 116 defines a distance of substrate 128 between HVNW 130 and doped region 118, which is used to detect and pick up a signal from terminal 120 in HVNW 130 via diode 132. The magnitude of the capacitive coupling between terminal 120 and doped region 118 is dependent on the physical properties of substrate 128 as well as the size of area 116. For example, the magnitude of the capacitive coupling between terminal 120 and doped region 118 is reduced as the size of area 116, e.g., the linear distance between HVNW 130 and doped region 118, is increased. In some embodiments, the distance between HVNW 130 and doped region 118 may range from approximately 1 μm to approximately 300 μm, although one skilled in the art will understand that HVNW 130 and doped region 118 may be disposed from one another at other distances.

Figure 2B:
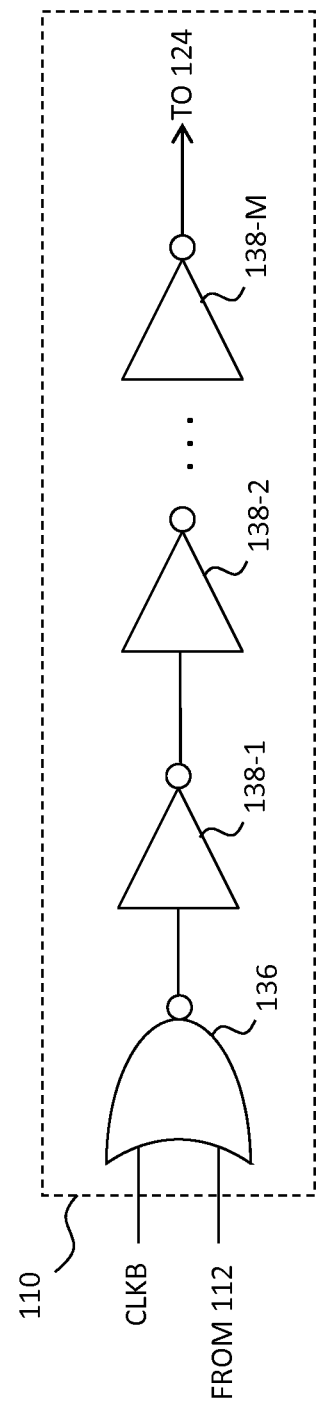

FIGS. 2A and 2B respectively illustrate examples of delay circuits 108 and 110. Referring first to FIG. 2A, high-side delay circuit 108 includes a NOR logic gate 132 receiving the input signal CLK at one input and the feedback signal output by low-side delay circuit 110 at a second input. The output of NOR gate 132 is fed through a number, M, of delay elements, e.g., 134-1, 134-2, . . . , 134-M (collectively referred to as "delay elements 134"), which may be implemented as inverters or buffers. The output of the last delay element 134-M in the series of delay elements is coupled to terminal 122 for outputting the signal to the gate of transistor 104 via terminal 122.

Low-side delay circuit 110 has a similar architecture with a NOR logic gate 136 receiving input signal CLKB at one input and the output of sense/debounce circuit 112 received at a second input. The output of NOR gate 136 is also fed through a number of delay elements, e.g., 138-1, 138-2, ..., 138-M (collectively referred to as "delay elements 138"), which also may be implemented as inverters or buffers. The output of the last delay element 134-M is output to node 124, which is coupled to the gate of transistor 106 and the input of NOR gate 132 of high-side delay circuit 108.

Figure 3:
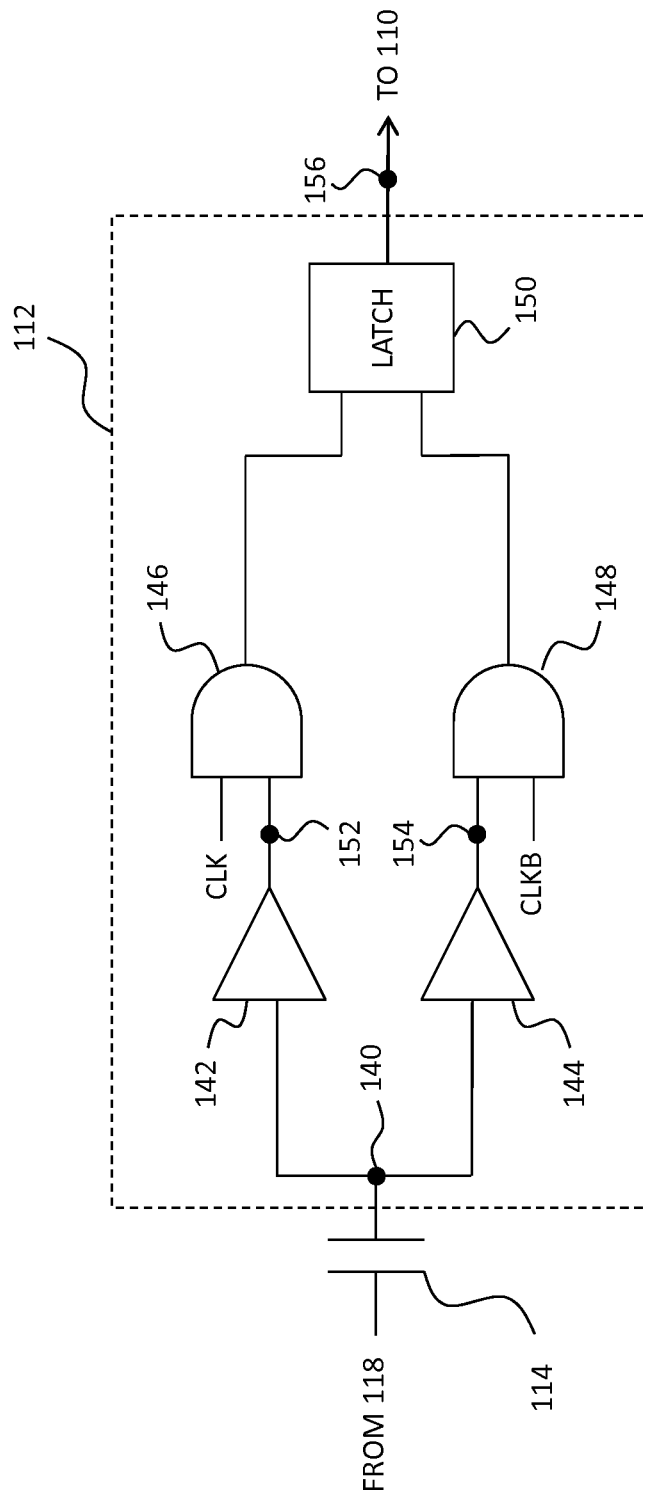
FIG. 3 is a block diagram of one example of a sense and debounce circuit in accordance with FIG. 1A.

FIG. 3 illustrates one example of a sense/debounce circuit 112. As shown in FIG. 3, sense/debounce circuit 112 includes a pair of amplifiers 142, 144 each having an input coupled to node 140. The output of amplifier 142 is coupled to an AND logic gate 146, which receives the input signal CLK at its other input. Similarly, amplifier 148 has its output coupled to one input of AND gate 148, which has its other input configured to receive input signal CLKB. The output of AND gates 146 and 148 are coupled to the inputs of a latch 150, which has its output coupled to NOR gate 136 of low-side delay circuitry 110 as illustrated in FIG. 2B. Latch may be implemented as a flip-flop such as, for example, an RS flip-flop, a D flip-flop, a JK flip-flop, or other latch as will be understood by one skilled in the art.

Figure 4:
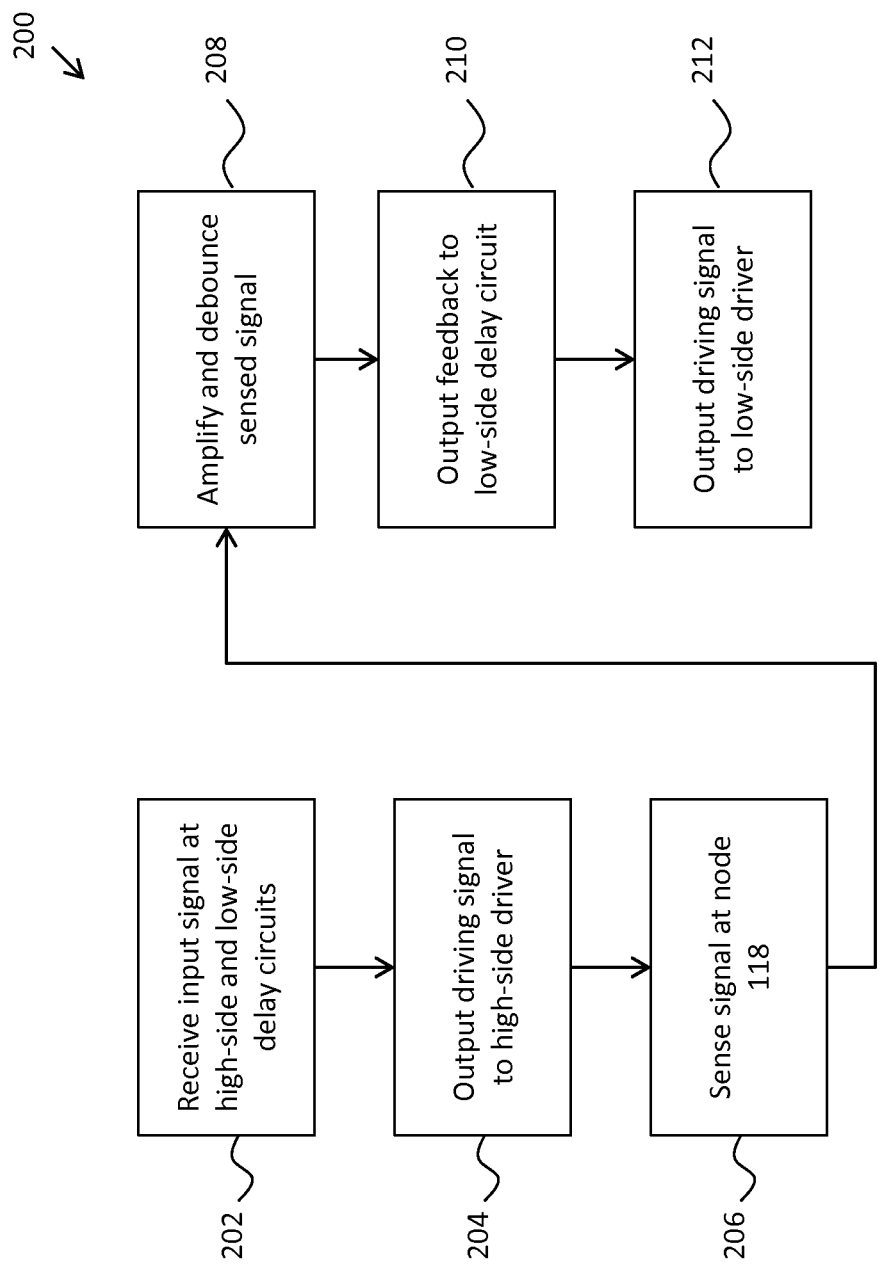
FIG. 4 is a flow diagram of one example of a method of operation of the improved non-overlap circuit illustrated in FIGS. 1A and 1B.

The operation of non-overlap circuit 100A is described with reference to FIGS. 1A-5 in which FIG. 4 is a flow diagram of one example of a method 200 of operation of non-overlap circuit 100A and FIG. 5 is a timing diagram of various signals of the non-overlap circuit. At block 202, an input signal is received at high-side and low-side delay circuits. For example, input signal CLK is received at one of the inputs of NOR gate 132 of high-side delay circuit 108 and input signal CLKB is received at an input of NOR gate 136 of low-side delay circuit 110 after passing through inverter 126.

If the input signal CLK is a low voltage, e.g., a logic zero, and the signal from node 124 received at the second input of NOR gate 132 is also a logic zero, then the output of NOR gate 132 is a high voltage, e.g., a logic one. If the input signal CLK is a logic one, then the output of NOR gate 132 will be a logic zero regardless of what the voltage is at node 124. Similarly, if the voltage at node 124 is a logic one, then the output of NOR gate 132 will be a logic zero regardless of what the voltage is of the input signal CLK due to the truth table for NOR gate 132.

At block 204, high-side delay circuit 108 outputs a delayed version of input signal CLK from terminal 120 to terminal 122. If the signal output to terminal 122 from terminal 120 is a logic one, then transistor 104 is in a current-conducting or 'on' state such that current flows from the source to the drain of transistor 104 effectively coupling $V_{DD}$ to the drain of transistor 104. If the signal output to terminal 122 from terminal 120 is a logic zero, then transistor 104 is in a non-current-conducting or 'off' state such that current does not flow from the source to the drain of transistor 104.

The signal output from terminal 120 is sensed at the doped region of node 118 at block 206. For example, the voltage at doped region 118, $V_{118}$, is pulled low at time $t_2$ in FIG. 5A, which occurs after the transition of the input signal CLK from logic low to logic high at time $t_1$. As described above, the magnitude of the signal sensed at node 118 due to the coupling between HVNW 130 and doped region 118 is based on the size of area 116, which is disposed between HVNW 130 and doped region 118. For example, decreasing the area 116, i.e., decreasing the distance between HVNW 130 and doped region 118, increases the coupling between terminal 120 and node 118 whereas increasing area 116 decreases the coupling between terminal 120 and node 118.

Figure 5A:
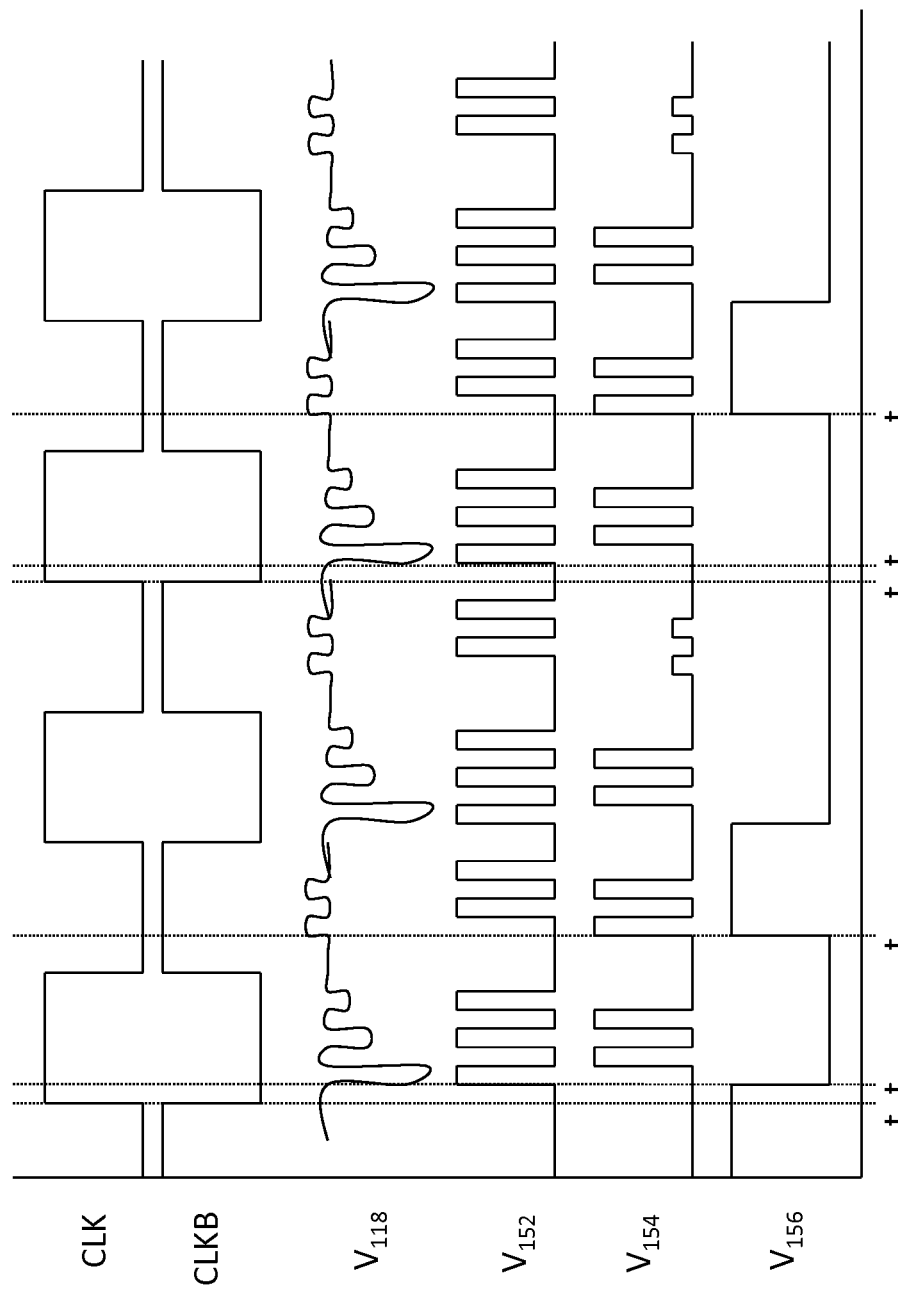
FIGS. 5A and 5B are timing diagrams illustrating the transitioning of various signals in an non-overlap circuit in accordance with FIGS. 1A and 1B.

At block 208, the signal sensed by doped region 118 is received at sense/debounce circuit 112 where the signal is amplified and debounced. For example, capacitor 114 charges and discharges in response to the voltage at node 118. Amplifier 144 is configured to amplify the positive polarity of the discharging capacitor 114 to node 154, which is disposed between AND gate 154 and the output of amplifier 144, and amplifier 142 is configured to amplify the negative polarity of the discharging capacitor 114 to node 152, which is disposed between AND gate 146 and the output of amplifier 142. The voltage transitions of nodes 152 and 154 is illustrated in FIG. 5A between times $t_2$ and $t_3$. For example, the voltage at node 152, $V_{152}$, is high when the voltage at node 154, $V_{154}$, is low, and $V_{152}$ is low when $V_{154}$ is high.

The oscillating voltages at nodes 152 and 154 are fed through AND gates 146 and 148 and latch 150 to debounce the circuit. For example, when $V_{152}$ and input signal CLK are both high, AND gate 146 outputs a logic one to latch 150. For any other combination of inputs to AND gate 146, AND gate 146 will output a logic zero. Similarly, when $V_{154}$ and input signal CLKB are both logic highs, then AND gate 148 outputs a logic one to latch 150. For all other combinations of inputs at AND gate 148, the output of AND gate 148 is a logic zero. In embodiments when latch 150 is implemented as an RS flip-flop, latch 150 will maintain its current output when the signals received from the outputs of AND gates 146 and 148 are both logic lows. When AND gate 148 coupled to the R input of latch 150 is a logic zero and the AND gate 146 coupled to the S input is a logic one, then latch 150 will output a logic zero. Conversely, latch 150 outputs a logic one when the AND gate 148 coupled to the R input is a logic one and the AND gate 146 coupled to the S input is a logic zero.

For example and referring again to FIG. 5A, the voltage at node 156, $V_{156}$, is initially set at a logic one until it transitions to a logic zero at time $t_2$, which occurs shortly after input signals CLK and CLKB respectively change from logic zero to logic one and from a logic one to a logic zero at time $t_1$. $V_{156}$ transitions from a logic one to a logic zero due to AND gate 146 outputting a logic one in response to input signal CLK and $V_{152}$ both being logic highs and AND gate 148 outputting a logic zero since input signal CLKB and $V_{154}$ both being logic zeroes.

At time $t_3$, AND gate 148 outputs a logic one in response to input signal CLKB and $V_{154}$ being logic ones, and AND gate 146 outputs a logic zero in response to input signal CLK and V152 being logic zeroes. The output of latch 150 transitions from a logic zero to a logic one in response to receiving a logic one from AND gate 148 and a logic zero from AND gate 146.

At block 210, the output of latch 150 is received at an input of NOR gate 136 of low-side delay circuit 110. NOR gate 136 outputs a signal to delay element 138-1 in response to the sensed feedback signal received from latch 150 and input signal CLKB, which are received at the respective inputs of NOR gate 136. For example, if the input signal CLKB is a logic zero, and the sensed feedback signal received from latch 150 is also a logic zero, then the output of NOR gate 136 is a logic one. If the input signal CLKB is a logic one, then the output of NOR gate 136 will be a logic zero regardless of what the voltage is of the feedback signal from latch 150. Similarly, if the voltage of the feedback signal from latch 150 is a logic one, then the output of NOR gate 136 will be a logic zero regardless of what the voltage is of the input signal CLKB due to the truth table for NOR gate 13B.

The low-side delay circuit 110 outputs a driving signal to the gate of transistor 106 at block 212. If the signal output to the gate of transistor 106 is a logic one, then transistor 106 is in a current-conducting or "on" state such that current flows from the source to the drain of transistor 106 effectively coupling ground to the drain of transistor 106. If the signal output to the gate of transistor 106 is a logic zero, then transistor 106 is in a non-current-conducting or "off" state such that current does not flow from the source to the drain of transistor 106.

Figure 5B:
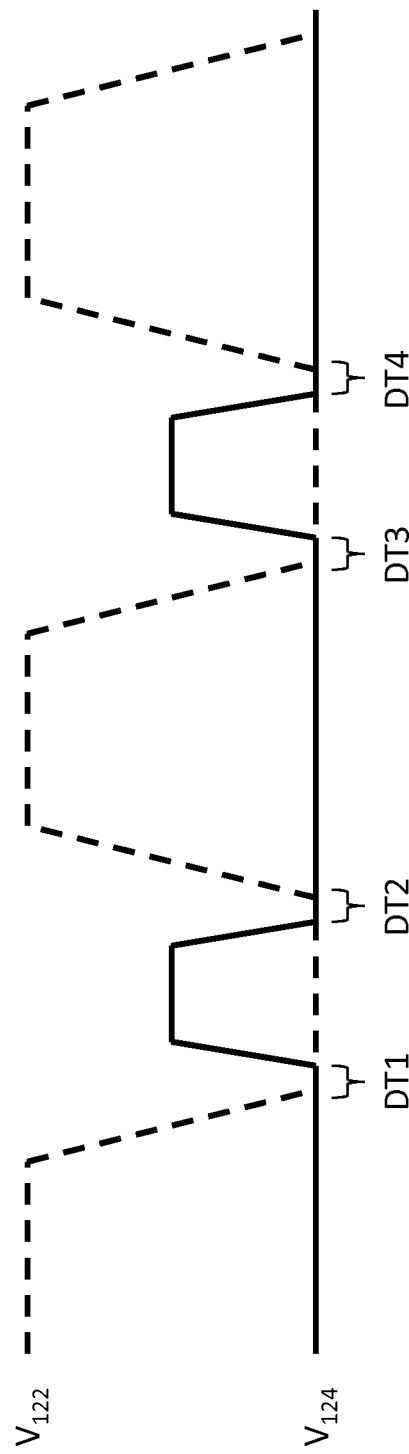

FIG. 5B is a voltage versus time graph illustrating the voltage transitions at node 122, $V_{122}$, which is coupled to the gate of transistor 104, and at node 124, $V_{124}$, which is coupled to the gate of transistor 106. As shown in FIG. 5B, the outputs of non-overlap circuit 100A provides deadtimes DT1, DT2, DT3, and DT4 between the transitions of $V_{122}$ and $V_{124}$. These deadtimes ensure that transistors 104 and 106 are not turning on or off at the same time. Deadtimes D1 and D3 are provided by low-side delay circuit 110 as they control the voltage swing of $V_{124}$, and deadtimes D2 and D4 are provided by high-side delay circuit 108 as they control the voltage swing of $V_{122}$.

Figure 6C:
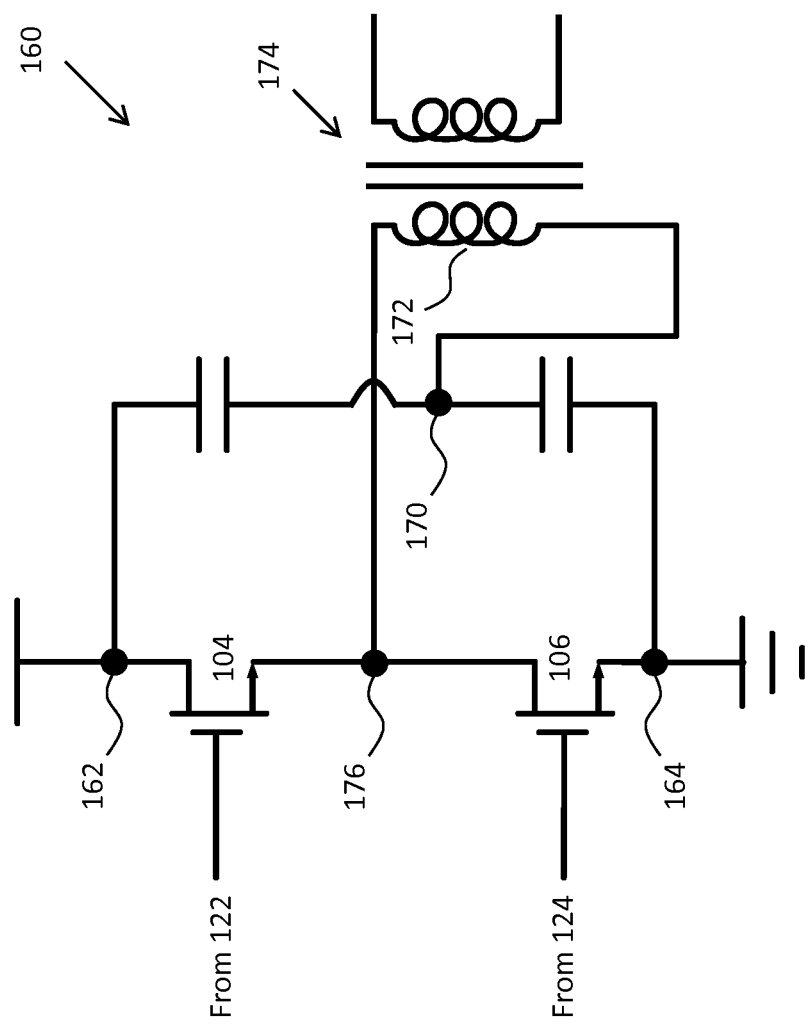
FIG. 6C is a circuit diagram of one example of a half-bridge architecture that may be driven by the non-overlap and driving circuitry illustrated in FIGS. 6A and 6B.

FIG. 6A illustrates another improved non-overlap circuit 100B coupled to a driving circuit 102. Driving circuit 102 includes a first driving transistor 104 and a second driving transistor 106, which may be coupled to a half-bridge 160, such as the one illustrated in FIG. 6C. The respective drains of first and second driving transistors are coupled together, the source of transistor 104 is coupled to supply voltage, $V_{DD}$, at node 162 and the source of transistor 106 is coupled to ground at node 164. Capacitors 166 and 168 are coupled together at node 170 and are respectively coupled to nodes 162 and 164. Node 170 is coupled to one side of coil 172 of transformer 174, and the second side of coil 172 is coupled to node 176 disposed between transistors 104 and 106.

Referring again to FIGS. 6A and 6B, non-overlap circuit 100B includes a high-side delay circuit 108 and a low-side delay circuit 110. Terminal 120 of high-side delay circuit 108 is connected to terminal 122 of driving circuit 102. Terminal 122 is coupled to the gate of transistor 104 and may be coupled to terminal 120 via wire bonding as will be understood by one skilled in the art.

A sense and debounce circuit 112 is coupled to a capacitor 114 that is coupled to an area 116 at node 118. Area 116 may be undoped or lightly doped bulk silicon or other semiconductor disposed adjacent to the low-side high-voltage n-well ("HVNW") of driving circuit 102. Sense and debounce circuit 112 is coupled to an input of low-side-delay circuit 110 for providing feedback timing signals from high-side delay circuit 108 to low-side delay circuit 110. The output of low-side delay circuit 110 is coupled to the gate of transistor 106 and is configured to turn on and off transistor 106. Feedback is provided from the output of low-side delay circuit 110 to an input of high-side delay circuit 108 from node 124, which is disposed between low-side delay circuit 110 and the gate of transistor 106.

High-side delay circuit 108 and low-side delay circuit 110 receive AC voltage input signals, CLK and CLKB, at respective second inputs. The AC input signal may be received from external circuit (not shown) or from an AC voltage source as will be understood by one skilled in the art. The input signal CLK received at high-side delay circuit 108 may be the inverse of the input signal CLKB received at low-side delay circuit 110. For example, the input signal CLK received at high-side delay circuit 108 may be passed through an inverter 126 to provide input signal CLKB to low-side delay circuit 110.

FIG. 6B is a partial cross-sectional view of a portion of high-side delay circuit 108 and area 116 as identified by square 6B in FIG. 6A. As shown in FIG. 6B, node 118 to which capacitor 114 is coupled is a doped region disposed in a semiconductor substrate 128. In some embodiments, semiconductor substrate is a p-type substrate and doped region 118 is a P+ doped region. One skilled in the art will understand that substrate 128 and doped region 118 may be n-type substrates and doped regions. As described above, a diode 132 is defined at the interface of HVNW 130 and substrate 128. Area 116 defines a distance of substrate 128 between HVNW 130 and doped region 118. The source 106*a* of transistor 106 is coupled to ground and is disposed apart from the drain 106*b* of transistor 106, which is coupled to the drain of transistor 104 (not shown).

In operation, the drain of transistor 106 generates a reverse current from ground to node 176 when transistor 104 is turns off such that the inductor current through coil 172 remains substantially constant. A current path also develops from sense/debounce circuit 112 to the drain 106*b* of transistor 106 through junction diode 132 and generates an instantaneous pulse at node 118. This instantaneous pulse is used as a feedback signal to sense/debounce circuit 112 to complete the non-overlap loop.

In some embodiments, a non-overlap circuit includes a first delay circuit configured to receive a first input signal and output a first control signal to a driver circuit, sensing circuitry configured to sense a current generated in response to the first control signal coupled through bulk semiconductor of a semiconductor substrate and produce a feedback signal response to the current, and a second delay circuit. The second delay circuit configured to receive the feedback signal from the sensing circuitry and a second input signal and output a second control signal to the driver circuit based on the sensed feedback signal and the second input signal.

In some embodiments, a method includes receiving an input signal at a first delay circuit, outputting a first control signal from the first delay circuit to a driver circuit in response to the input signal, producing a feedback signal in response to sensing a current generated in response to the first control signal through bulk semiconductor of a semiconductor substrate and receiving a second input signal and the feedback signal at a second delay circuit. A second control signal is output from the second delay circuit to the driver circuit in response to the second input signal and the feedback signal.

In some embodiments, an non-overlap circuit includes first and second delay circuits for respectively outputting first and second control signals to a driver circuit. The first delay circuit outputs the first control signal in response to receiving a first feedback signal from an output of the second delay circuit and a first input signal. The second delay circuit outputs the second control signal in response to receiving a second input signal and a second feedback signal. A first doped region of a first type is disposed within a semiconductor substrate in which the first and second delay circuits are disposed. The first doped region of the first type is spaced apart from a second doped region of a second type from which the first control signal is output. The first doped region of the first type is configured to sense a current generated in response to the first control signal through the semiconductor substrate. Circuitry is coupled to the first doped region of the first type and is configured to output the first feedback signal.

The improved non-overlap circuits disclosed herein advantageously utilize a feedback path that is sensed through a semiconductor substrate, which limits the potential a shoot-through current that could potentially damage the non-overlap circuit. Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A non-overlap circuit, comprising:
a first delay circuit configured to receive a first input signal and output a first control signal to a driver circuit;
sensing circuitry configured to sense a current from the driver circuit in response to the first control signal through bulk semiconductor of a semiconductor substrate and produce a feedback signal in response to current; and
a second delay circuit configured to receive the feedback signal from the sensing circuitry and a second input signal, and output a second control signal to the driver circuit based on the sensed feedback signal and the second input signal,
wherein the first delay circuit is configured to receive a second feedback signal from an output of the second delay circuit.

2. The non-overlap circuit of claim 1, wherein the sensing circuitry is spaced apart from an output of the first delay circuit by the bulk semiconductor of the semiconductor substrate.

3. The non-overlap circuit of claim 1, wherein an output of the first delay circuit is formed in a high-voltage well of a first type and the sensing circuitry is coupled to a doped region of a second type in the semiconductor substrate that is separated from the output of the first delay circuit by a portion of the semiconductor substrate.

4. The non-overlap circuit of claim 3, wherein the high voltage well of the first type is an n-type semiconductor and the doped region of the second type is a p-type semiconductor.

5. The non-overlap circuit of claim 3, wherein the sensing circuit is coupled to the doped region through a capacitor.

6. The non-overlap circuit of claim 5, wherein the sensing circuitry includes
a first amplifier coupled to the capacitor and configured to amplify a negative polarity,
a second amplifier coupled to the capacitor and configured to amplify a positive polarity,
a first logic gate configured to receive an output of the first amplifier and the first input signal,
a second logic gate configured to receive an output of the second amplifier and the second input signal, and
a latch configured to receive outputs from the first and second logic gates and output the feedback signal to the second delay circuit.

7. A method, comprising:
receiving an input signal at a first delay circuit;
outputting a first control signal from the first delay circuit to a driver circuit in response to the input signal;
producing a feedback signal in response to sensing a current generated in response to the first control signal through bulk semiconductor of a semiconductor substrate;
receiving a second input signal and the feedback signal at a second delay circuit; and
outputting a second control signal from the second delay circuit to the driver circuit in response to the second input signal and the feedback signal,
wherein the first delay circuit receives a second feedback signal from an output of the second delay circuit and outputs the first control signal to the driver circuit in response to the input signal and the second feedback circuit.

8. The method of claim 7, wherein producing the feedback signal includes
amplifying a negative polarity of the sensed current received from a capacitor,
amplifying a positive polarity of the sensed current received from the capacitor,
outputting a first signal from a first logic gate to a latch in response to receiving an amplified negative polarity and the first input signal,
outputting a second signal from a second logic gate to the latch in response to receiving an amplified positive polarity and the second input signal, and
outputting the feedback signal from the latch.

9. The method of claim 7, wherein the sensing includes capacitive coupling between an output of the first delay circuit and a doped region coupled to sense circuitry.

10. The method of claim 7, wherein the first control signal is sensed at a first doped region of a first type in the semiconductor substrate that is spaced apart from a second doped region of a second type in the semiconductor substrate.

11. The method of claim 10, wherein the first doped region of a first type is a p-type semiconductor and the second doped region of a second type is a high-voltage n-well.

12. A non-overlap circuit, comprising:
first and second delay circuits for respectively outputting first and second control signals to a driver circuit, the first delay circuit outputting the first control signal in response to receiving a first feedback signal from an output of the second delay circuit and a first input signal, the second delay circuit outputting the second control signal in response to receiving a second input signal and a second feedback signal;
a first doped region of a first type disposed within a semiconductor substrate in which the first and second delay circuits are disposed, the first doped region of the first type spaced apart from a second doped region of a second type from which the first control signal is output, the first doped region of the first type configured to sense a current generated in response to the first control signal through the semiconductor substrate; and
circuitry coupled to the first doped region of the first type configured to output the first feedback signal.

13. The non-overlap circuit of claim 12, wherein the circuitry includes
a first amplifier coupled to a capacitor coupled to the first doped region of the first type, the first amplifier configured to amplify a negative polarity,
a second amplifier coupled to the capacitor and configured to amplify a positive polarity,
a first logic gate configured to receive an output of the first amplifier and the first input signal,
a second logic gate configured to receive an output of the second amplifier and the second input signal, and
a latch configured to receive outputs from the first and second logic gates and output the feedback signal to the second delay circuit.

14. The non-overlap circuit of claim 12, wherein the first doped region of the first type is a p-type semiconductor, the second doped region of the second type is a high voltage n-well, and the semiconductor substrate includes bulk silicon.

15. The non-overlap circuit of claim 12, wherein the first delay circuit includes a logic gate configured to receive the first input signal at one input and the first feedback signal from the second delay circuit at a second input.

16. The non-overlap circuit of claim 15, wherein the first delay circuit includes one or more delay elements coupled to an output of the logic gate.

17. The non-overlap circuit of claim 12, wherein the second delay circuit includes a logic gate configured to receive the second input signal at one input and the second feedback signal from the circuitry at a second input.

18. The non-overlap circuit of claim 17, wherein the second delay circuit includes one or more delay elements coupled to an output of the logic gate.

* * * * *